United States Patent [19]

Grace

[11] 3,855,542

[45] Dec. 17, 1974

[54] BROAD BAND HIGH FREQUENCY DIODE AMPLIFIER

[75] Inventor: Martin I. Grace, Framingham, Mass.

[73] Assignee: Sperry Rand Corporation, New York, N.Y.

[22] Filed: Nov. 5, 1973

[21] Appl. No.: 413,119

[52] U.S. Cl. .................... 330/34, 330/5, 333/84 M, 331/99, 331/107 R

[51] Int. Cl. .............................................. H03b 7/14

[58] Field of Search ................ 330/5, 5.5, 34, 61 A; 331/99, 107 R; 333/84 M

[56] References Cited

UNITED STATES PATENTS

| | | | |
|---|---|---|---|
| 3,255,421 | 6/1966 | Skalski | 330/34 |
| 3,648,185 | 3/1972 | Acket et al. | 330/5 |
| 3,721,919 | 3/1973 | Grace | 331/99 X |
| 3,743,967 | 7/1973 | Fitzsimmons et al. | 330/34 X |
| 3,793,539 | 2/1974 | Clorfeine | 331/107 R |

*Primary Examiner*—John S. Heyman
*Attorney, Agent, or Firm*—Howard P. Terry

[57] ABSTRACT

A TRAPATT semiconductor diode is coupled for broad band amplification of oscillating high frequency electromagnetic fields in a planar transmission line network, the apparatus taking the form of a single-port high frequency amplifier device. Stable broad band amplification is achieved by suppressing time-delayed triggering, the effective band pass network of the device being connected to the active diode terminals less than one half wave length therefrom.

8 Claims, 5 Drawing Figures

BROAD BAND HIGH FREQUENCY DIODE AMPLIFIER

The invention herein described was made in the course of or under a contract or subcontract thereunder, (or grant) with the Department of the Air Force.

BACKGROUND OF THE INVENTION

1. Field of the Invention

The invention pertains to high frequency and microwave transmission line semiconductor diode amplifiers and more particularly relates to means in such semiconductor diode energy converters for maintaining stable broad band amplification operation by effectively suppressing time-delayed triggering as an oscillation initiating and sustaining mechanism.

2. Description of the Prior Art

Semiconductor diode oscillators available in the prior art, particularly high-efficiency mode diode oscillators, have made beneficial use in narrow band operation of time-delayed triggering phenomena whose operation may be explained as follows. Where a short circuit is placed at greater than a half wave distance at the mid-operating fundamental frequency from the diode, consider that a transient over-voltage sufficient in magnitude to initiate a travelling avalanche zone is placed across the diode. While the consequent avalanche zone travels across the depletion region of the diode, the voltage across the diode drops. When the avalanche zone front has completely crossed the diode, the instantaneous voltage on the diode is substantially zero. Accordingly, a short duration voltage pulse is generated at the diode whose magnitude is substantially equal to the diode break-down voltage. This short duration voltage pulse cannot do else than propagate down the transmission line in which the diode is connected. Upon reaching any effective short circuit placed a half wave distance or farther from the diode, the travelling pulse is inverted and is reflected to return to the diode with a total time delay of $\eta/c$, where $c$ is the velocity of propagation within the transmission line. The delayed pulse instantaneously drives the voltage across the diode to about twice its break down voltage, thus pretriggering another avalanche shock wave within the diode. Such an event permits the entire process repeatedly to cycle. For high-efficiency-mode oscillators, time delayed triggering may beneficially be a major source of steady state oscillations. However, where stable and broad band amplification is desired, profitable use of the time-delayed triggering mechanism has been difficult and it becomes desirable to resort to circuit configurations and modes of their operation tending to suppress time-delayed triggering.

SUMMARY OF THE INVENTION

The invention is a broad band high frequency or microwave diode amplifier device operating in a manner independent of time-delayed triggering and employing a high efficiency mode diode as its active energy conversion device. A unidirectional potential is applied across the semiconductor diode such that it is biased near its avalanche break down level. Any high frequency or microwave signal, when imposed upon the bias potential, produces large changes in the instantaneous diode voltage and current, the consequent diode current wave containing second and other harmonic components of the fundamental of the signal to be amplified. The novel planar diode amplifier configuration employs a triple resonator impedance-matching band pass filter effectively located as closely to a high efficiency mode diode as physically possible (less than a half wave length). The effective band pass filter presents a very low impedance to the active diode at harmonic frequencies and therefore does not significantly alter the voltage wave form appearing across the diode. The important improvement in band width is accomplished by multiple tuning at the median fundamental frequency in a manner not affecting the harmonic impedances which control the exciting wave form across the diode. Large fundamental frequency current flow is permitted by the active diode and large second harmonic currents also flow because of the inherently nonlinear nature of the diode. The high voltages at the second harmonic greatly aid in generating the large current amplitude swings required to trigger avalanche shock fronts in the diode.

DESCRIPTION OF THE PREFERRED EMBODIMENT

Figures 1, 2:
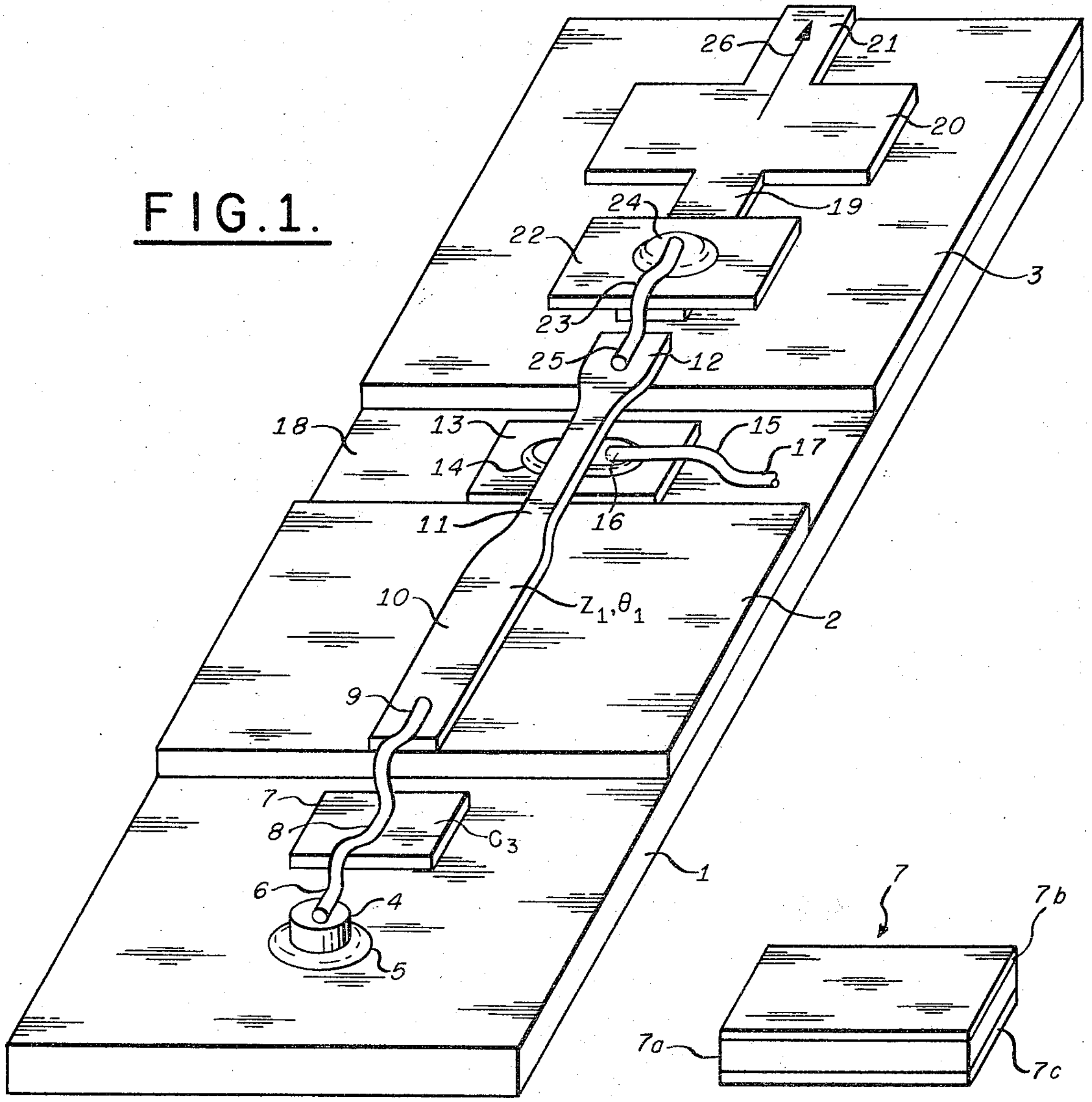
FIG. 1 is a perspective view of a preferred form of the invention.
FIG. 2 is an enlarged perspective view of a portion of FIG. 1.

Referring to FIG. 1, the novel microcircuit high frequency amplifier is shown in planar transmission line form, the transmission line itself consisting in part of a copper or other conductive metal ground plane 1 and dielectric support or substrate portions 2 and 3 which may be constructed of aluminum oxide or other similar ceramic materials and permanently affixed to a surface of the ground plane 1. The transmission line system further includes elements of similar conductive material affixed to an upper surface of the insulating substrate portions 2 and 3. The elements 10, 12, and 19, for example, of the upper conductor system may be formed in a conventional manner by being bonded by evaporation of metal in a vacuum chamber through a suitable mask onto the free upper surface of support or substrate portions 2 and 3. A thin layer of chromium, for example, may be first evaporated through the mask onto the substrate surface, since chromium forms an excellent bond with dielectric materials such as aluminum oxide. A relatively thick layer of gold may next be evaporated through the same mask, the gold forming a firm bond with the initial chromium layer, and affording a highly conductive surface layer for high frequency or microwave currents. Silver or other good electrical conductors may be used in place of gold. Other processes may be used for forming the transmission line elements on the free surfaces of substrate portions 2 and 3. For example, a method described by R. M. Denhard in the U.S. Pat. No. 3,585,533, issued June 15, 1971 and assigned to the Sperry Rand Corporation, may be employed. It will be understood that the proportions of the various layers 1, 2 and 3 are somewhat exaggerated in the figures simply for the purpose of providing clarity in the drawings. For example, the transmission line elements 10, 12, 19, and the like may be relatively thin layers of conducting material. It will further be understood that the term high frequency, as used in this specification and the claims is intended also to include the microwave frequency bands.

Figure 4:
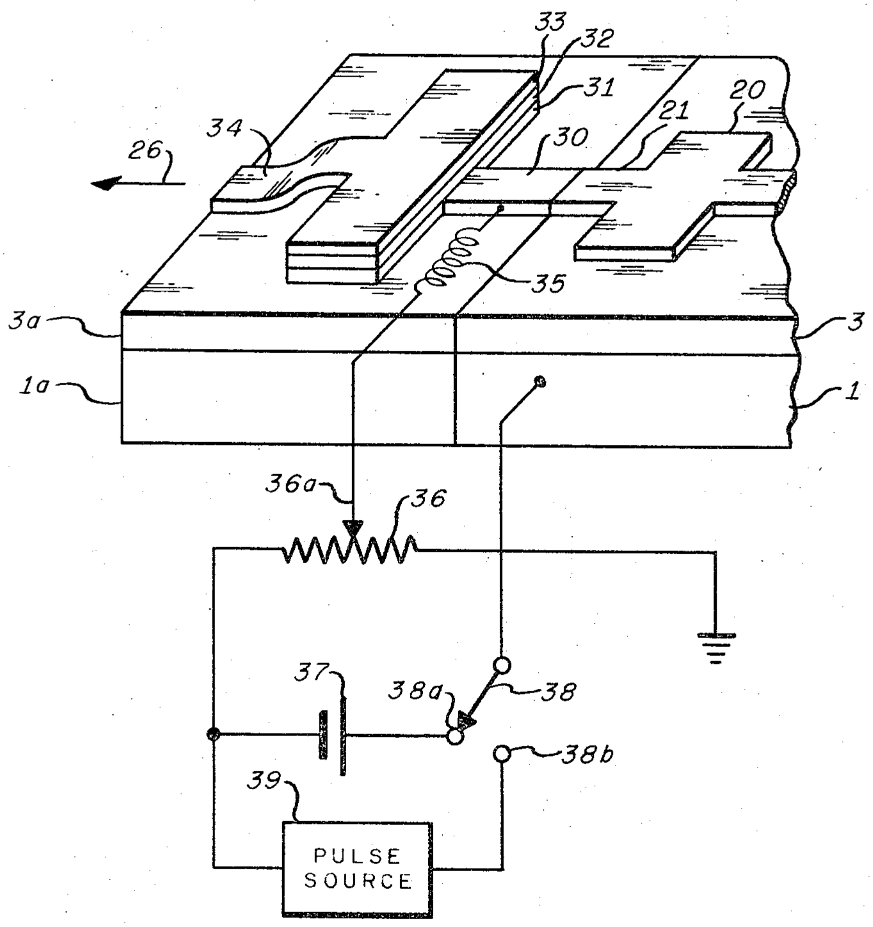
FIG. 4 is a partial perspective view of diode biasing elements which may be used with the amplifier of FIG. 1.

The active part of the planar transmission line amplifier in which energy from the direct current source shown in FIG. 4 is employed to amplify microwave or high frequency energy is associated with the TRAPATT diode 4 conductively soldered or otherwise affixed at location 5 to a surface of the ground plane conductor 1. The electrode of diode 4 opposite location 5 is coupled by an inductive wire 6 to one end of transmission line element 10 to which it is conductively affixed. However, it is also coupled to one electrode 7*b* of a capacitor 7, identified as having a capacitance $C_3$. The conductive wire 6 is bent or is otherwise shaped so that it may be soldered or affixed in a conventional manner at 8 to upper layer 7*b* of capacitor 7. The wire 6 thus loops over the space above ground plane 1 between diode 4 and capacitor 7. In addition, the wire 6 is again looped over ground plane 1 at the gap between capacitor 7 and the end of transmission line element 10, to which it is conductively affixed at end 9.

As seen in the enlarged drawing of FIG. 2, capacitor 7 consists of a thin section of aluminum oxide or other ceramic, both sides of the insulator section 7*a* being coated with thin gold layers 7*b* and 7*c*. These gold layers or other thin layers 7*b* or 7*c* make it readily possible to solder or otherwise affix the surface of layer 7*c* of capacitor 7 to the free surface of ground plane 1 and to solder the wire 6 to the opposite surface 7*b* at location 8. In this manner, the high efficiency diode 4 is coupled to a transmission line element 10 having impedance characteristics $Z_1$, $\theta_1$.

Figure 3:
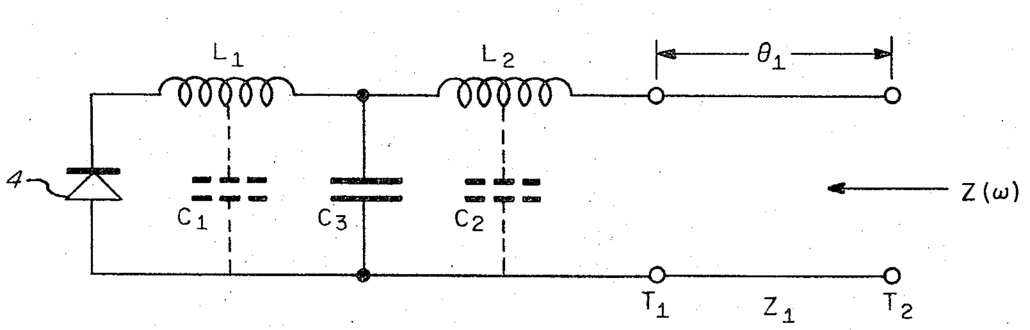
FIG. 3 is an equivalent circuit diagram useful in explaining the operation of a part of the apparatus of FIG. 1.

It will be seen from FIG. 3 that the high efficiency mode diode 4 is thus coupled to the transmission line including transmission line element 10 by a network generally similar to the lumped constant network of FIG. 3. Here, the portion of wire 6 between diode 4 and location 8 is represented by the inductance $L_1$. The loop of wire between diode 4 and location 8 has an effective capacitance $C_1$ with respect to ground plane 1. The lumped capacitor $C_3$ represents the capacitance of capacitor 7 of FIG. 1. The portion of wire 6 between locations 8 and end 9 has an effective inductance $L_2$ and a capacitance $C_2$ with respect to ground plane 1. The transmission line element 10 is represented in FIGS. 1 and 3 as having a length $\theta_1$ and an impedance $Z_1$ between reference planes $T_1$ and $T_2$.

The conductive transmission line element 10 has first and second ends and extends as a constricted conductor 11 for matching purposes across a gap between substrate or support portions 2 and 3, being affixed to the free surface of substrate portion 3 at end 12. A series resonant circuit is formed within the gap between substrate portions 2 and 3, the semiconductor base 13 of a metal oxide semiconductor capacitor being affixed to the surface 18 of ground plane 1 between substrate portions 2 and 3; thus, one conducting electrode of capacitor 13 is conductively connected to surface 18. The other conductive electrode 14 is soldered or otherwise conductively affixed to the upper electrode of the MOS capacitor 13. For providing an inductive element, a conductive wire 15 is attached at 16 to electrode 14 and is soldered or otherwise attached at 17 to the conductive surface 18.

The final output section of the planar transmission line system has a conductive transmission line element 19 having first and second ends and affixed, as before, on the free surface of a dielectric portion 3. This transmission line element 19 has an end or extension 21 from which high frequency or microwave energy may be withdrawn in the sense of arrow 26. Transmission line elements 10, 12, 19 and 21 will generally display substantially the same impedance. Between transmission lines sections 19 and 21 there is interposed an impedance matching transformer 20 of conventional type having a quarter wave length dimension in the direction of energy flow for the median operating wavelength. The transmission lines sections 12 and 19 are joined by a circuit composed in part of a conventional MOS capacitor 22 whose nether electrode surface is conductively affixed to a surface of transmission line portion 19. The opposite electrode 24 of MOS capacitor 22 is coupled by the wire loop 23 to transmission line section 12, to which is conductivity joined at location 25.

Figure 5:
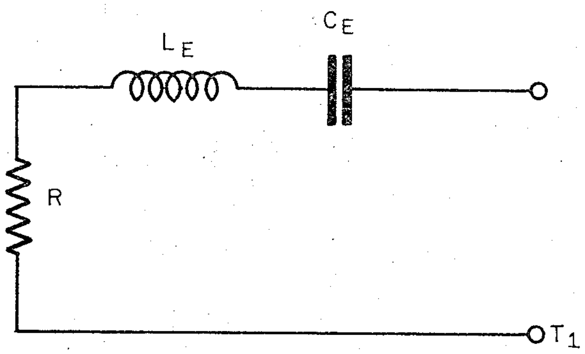
FIG. 5 is an equivalent circuit diagram useful in explaining the operation of a part of the apparatus of FIG. 1.

The equivalent circuit elements by which the active diode 4 is customarily represented are its negative resistance −R, its shunt depletion layer capacitance, and a shunt electronic reactance provided by the effect of impact ionization processes. It is seen that a series resonant circuit is formed at diode 4 in cooperation with the inductances presented by wire 6, the physical capacitor $C_3$, and the effective capacitors $C_1$ and $C_2$; thus, a first series resonant circuit is formed by the semiconductor diode 4, the short sections of inductive wire 6 representing inductors $L_1$ and $L_2$, the lumped capacitor $C_3$, and the transmission line section 10, these forming the representative lumped constant circuit of FIG. 3, particularly at the median operating wavelength. Over the operating frequency range, the real part of the impedance $Z(\omega)$ is relatively consistent. The imaginary part of the impedance $Z(\omega)$ is such that the diode and microwave circuit just discussed can be simply represented by the series resonant circuit illustrated in FIG. 5.

The elements found on surface 18 between dielectric portions 2 and 3 provide a second resonator, this resonator being a shunt resonator formed of the capacitance of the MOS capacitor 13 and the inductance of the wire 15. The size and length of wire 15 are chosen in such a manner that this shunt resonator is resonant at the median operating wavelength. The MOS capacitor 22 and the conductive wire 23 cooperate to form a third resonant circuit, capacitor 22 and the inductive lead 23 acting as a series resonator; resonance is again at the median operating frequency. It will be seen that the low pass filter commonly employed in the prior art at a significant separation from the active diode is replaced by the foregoing three resonators whose characteristics are chosen to give the desired amplifier band pass response, behaving like a band pass impedance matching filter placed physically close to diode 4.

The TRAPATT diode 4 employed in the invention may be a diode of the type generally known in the art as an avalanche transit time or high efficiency mode diode. For example, diode 4 may be an epitaxial silicon or other pn or step or abrupt junction diode. A pnn+ or other punch-through diode may be used in which the electric field punches through a substrate at reverse break down if of suitable amplitude. Such diodes have been formed, for example, by diffusing boron from a boron nitride source into a phosphorous doped epitaxial material on a heavily doped antimony substrate. The thickness of the epitaxial layer may be correctly adjusted during manufacture by etching, prior to diffusion, so as to produce the abrupt pn device pnn+structure.

Punch-through $p^+n\ n^+$ diode devices with breakdown voltages typically in the range of 75 to 85 volts and with active diode areas of about $10^{-4}$ cm$^2$, for example, be employed; these may be fabricated either by conventional diffusion of boron into $nn^+$ silicon wafers or similarly by diffusion of phosphorous into $pp^+$ silicon wafers. Single or multiple ring diode structures mounted on a diamond macle and of the type disclosed by Harry Kroger in the U.S. Pat. No. 3,684,901 for a "High Frequency Energy Transducer and Method of Manufacture" and assigned to the Sperry Rand Corporation may alternatively be employed. Other suitable mesa diodes are the subjects of U.S. Pat. application Ser. No. 222,771, filed Feb. 2, 1972 of Harry Kroger and C. N. Potter for "A Dual Mesa Ring-Shaped High Frequency Diode" and of the U.S. Pat. application Ser. No. 223,616, filed Feb. 4, 1972 of Harry Kroger and C. N. Potter for "A High Frequency Diode and Method of Manufacture," both applications being assigned to Sperry Rand Corporation.

Referring now to FIG. 4, it will be appreciated that the output section 21 of FIG. 1 will normally be provided with an agency for providing a bias current for excitation of the amplifier. A suitable bias supply for diode 4 is shown in FIG. 4 attached to the output transmission line section 21 of the amplifier of FIG. 1, the arrangement including respective extensions 1*a* and 3*a* of the ground plane 1 and the dielectric portin 3 of FIG. 1. The output line section 21 of the amplifier is extended to form the planar conductor 30. Conductor 30 is capacity coupled to the final high frequency output transmission line section 34 through the high frequency coupling capacitor including conductive plates 31 and 33 and the dielectric sheet 32 interposed between conductors 31 and 33. Transmission line section 30 is coupled to an inductive element 35 which, in turn, is coupled to the tap 36*a* of a potentiometer 36 connected across battery 37 when switch 38 turned to tap 38*a*. One side of each of elements 36 and 37 is grounded and is also conductively coupled to ground plane 1. It is seen that the bias current is supplied through inductor 35, transmission line conductor 30 and through transmission line conductors 21, 19, 12, 11 and 10 to the diode 4 (FIG. 1) and thence back to battery 37 in the conventional manner. It will be appreciated that the battery 37 illustrated in FIG. 4 is merely representative of suitable bias current sources available in the prior art. For example, pulsed operation of the amplifier may be employed by substituting pulse source 39 for battery 37 by moving switch 38 to contact 38*b*.

It will readily be understood by those skilled in the art that the novel high frequency diode amplifier is illustrated as a single port device in FIGS. 1 and 4. For introduction of high frequency energy and its extraction, a leftward extension of transmission line element 34 may be coupled directly to one port of a high frequency signal circulator. Another port of the signal circulator may be used in the usual manner to inject signals to be amplified into the amplifier via transmission line element 34, while a second port of the same circulator is used to couple the amplified signals out for supply to a utilization device.

It is seen that the novel planar diode amplifier configuration employs a triple resonator impedance — matching band pass filter effectively located as closely to the active diode 4 as physically possible (less than a half wavelength). The effective band pass filter presents a very low impedance to diode 4 at harmonic frequencies and therefore does not significantly alter the triggering voltage wave form appearing across the diode. The important improvement in band width is accomplished by multiple tuning at the median fundamental frequency in a manner not affecting the harmonic impedances which control the triggering wave form. Large fundamental frequency current flow is permitted by diode 4 and large second harmonic currents also flow because of the inherently non-linear nature of diode 4. The high voltages at the second harmonic greatly aid in generating the large current amplitude swings required to trigger avalanche shock fronts in diode 4.

The often used time-delayed triggering mechanism is not selected to develop the shock front, since the desired device is an amplifier where TRAPATT operation may be externally triggered. In fact, time-delayed triggering is effectively suppressed in the present device by employing a diode exhibiting negative resistance at the second harmonic, thereby enhancing production of the second harmonic energy needed for triggering. Thus, the actual and equivalent circuits used for the TRAPATT amplifier of the present invention differ greatly from those of the conventional TRAPATT oscillator in that the normally operating amplifier exhibits a voltage wave form that is not sufficient to trigger an avalanche shock front in diode 4 unless an external voltage at the operating frequency is applied via transmission line 34. As noted, the novel diode amplifier differs from the conventional time-delayed triggered oscillator in that the effective band pass filter is placed close to diode 4, significantly reducing the rate of rise of voltage necessary to excite the avalanche shock front across diode 4. Time-delayed triggering is thus suppressed as an oscillation initiating mechanism.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. A high frequency signal amplifier comprising:

transmission line means having first and second high frequency signal conducting means, said first high frequency signal conducting means including first and second signal conducting portions supported in substantially parallel relation with respect to said second high frequency signal conducting means, first series resonant circuit means including diode means coupled between said second high frequency signal conducting means and a first end of said first signal conducting portion, second series resonant circuit means coupled between the second end of said first signal conducting portion and the first end of said second signal conducting portion, shunt resonant circuit means coupled to said first signal conducting portion and to said second high frequency signal conducting means intermediate said first and second ends of said first signal conducting portion, bias circuit means connected to said second end of said second signal conducting portion and said second high frequency signal conducting means for supplying a bias signal through said diode means.

2. Apparatus as described in claim 1 further including impedance matching means located intermediate said first and second ends of said second signal conducting portion.

3. Apparatus as described in claim 1 wherein said second signal conducting portion is supported by first dielectric support means affixed to a surface of said second high frequency conducting means.

4. Apparatus as described in claim 3 wherein said first signal conducting portion is supported adjacent its said first end by second dielectric support means affixed to said surface of said high frequency conducting means and at its said second end by said first dielectric support means.

5. Apparatus as described in claim 4 wherein said shunt resonant circuit means is placed between said first signal conducting portion and said second high frequency signal conducting means and between said first and second dielectric support means.

6. Apparatus as described in claim 1 wherein said first series resonant circuit means including diode means comprises;

said diode means and capacitor means each conductively coupled to said second high frequency signal conducting means, first inductor means conductively coupled opposite said second high frequency signal conducting means to said diode means and said capacitor means, and second inductor means conductively coupled to said first inductor means at said capacitor means and at said first end of said first signal conducting portion.

7. Apparatus as described in claim 6 wherein said shunt resonant circuit means comprises third inductor means and second capacitor means shunt connected between said first signal conducting portion and said second high frequency conducting means.

8. Apparatus as described in claim 6 wherein said second series resonant circuit means comprises fourth inductor means and third capacitor means series coupled between said first and second signal conducting portions.

* * * * *